United States Patent
Tzeng

(10) Patent No.: US 6,777,955 B1
(45) Date of Patent: Aug. 17, 2004

(54) NOISE VALUE EVALUATION METHOD FOR COOLING MODULE

(75) Inventor: Yih-Wei Tzeng, Taipei (TW)

(73) Assignee: Inventec Corporation, Taipei (TW)

( * ) Notice: Subject to any disclaimer, the term of this patent is extended or adjusted under 35 U.S.C. 154(b) by 24 days.

(21) Appl. No.: 10/376,279

(22) Filed: Mar. 3, 2003

(51) Int. Cl.$^7$ .............................................. G01R 29/26
(52) U.S. Cl. ...................................... 324/613; 361/695
(58) Field of Search ................................ 324/613, 614; 361/687, 688, 695

(56) References Cited

U.S. PATENT DOCUMENTS 5,513,951 A * 5/1996 Komoda et al. ............ 415/119
5,898,572 A * 4/1999 Shennib et al. ............. 361/713
6,650,757 B1 * 11/2003 Zhou et al. ................. 381/71.4

* cited by examiner

Primary Examiner—N. Le
Assistant Examiner—Walter Benson
(74) Attorney, Agent, or Firm—Birch, Stewart, Kolasch & Birch, LLP

(57) ABSTRACT

A kind of noise value evaluation method for cooling module, which is to confirm if the noise value of cooling module meets the specification at early design stage, determining whether to continue the next stage of engineering or to redesign to avoid modification of design at the later design stage which results in the delay of production process and the increase of cost.

8 Claims, 3 Drawing Sheets

NOISE VALUE EVALUATION METHOD FOR COOLING MODULE

BACKGROUND OF THE INVENTION

1. Field of the Invention

The invention relates to a noise value evaluation method, particularly a method that is applied in a cooling module and evaluates the possible noise value produced by the mentioned cooling module at the early stage of design.

2. Related Art

The problem of heat emission in computers generally refers to the heat emission of components in the host computer casing. Mentioned host computer components have a main board, power supply, hard disk, floppy disk drive, CD-ROM and casing. The main board has many heat sources like CPU, North Bridge chipset, memory, display card, and so on. Moreover, the hard disk is a component necessary to be paid attention to, for it is troublesome when the data stored hard disk has over-heat failure.

To assure the computer system is operating steadily, the components producing heat in a computer system are generally combined with a heat emission function, in which the components with lower heat emission will utilize a radiator directly to help its internal heat to release. However, the components with higher heat emission (e.g. CPU) use a radiator and a fan, which produces air flow to take away the heat from the mentioned radiator to cool the heat radiant components. Thus, there is heat emission.

However, along with the development of technology, the working frequency of CPU in present computer systems has reached over 1 GHz, wherein the heat emission is beyond the capability of traditional radiators. Thereby, some manufacturers and players try their best to increase the rotation speed of the heat emission fan, but along with the high speed of rotation, the number of fans is also increased, which results in more noise. So getting a balance point between the rotation speed of a fan and the noise it produces is the main purpose of this invention.

In the past design of fan, the designs of heat emission and noise were divided into two parts for consideration, and the heat emission is the preferential factor to be considered. All the tests, including noise tests will be conducted after the fan is designed and manufactured. If, according to noise tests, noise exceeds the permissible range, it will be required to return to the origin, and be redesigned and retested until the noise of the fan is within the permissible range.

As now the heat production of heat emission components in computers is increasing, there is need for increasing the quantity of airflow of the fan, but the permissible noise margin is very small. If the noise value does not meet the specification, it is difficult to modify the original design; but if it is really needed to modify the original design to reduce the noise value, then it delays the launch of the product, increasing manufacture-costs.

Therefore, it is important to take the heat emission and noise value of the fan in mind, in an early stage of the design, to avoid the delay of the production process and higher manufacture-costs later

SUMMARY OF THE INVENTION

An object of the present invention is to provide an evaluation method for the noise value of a cooling module. It is mainly about using methods, such as a computer software emulation system, numerical value operation experiments and product specification estimations, to analyze the characteristics of radiation and noise of the cooling module at an early stage of the design, and to identify if the noise value produced by the mentioned cooling module is within the permissible range to evaluate the feasibility of the engineering. Thus it avoids the delay of the production process and the repeated waste of manufacturing cost caused by design modifications in a later period of design.

The noise evaluation method for the cooling module in the present invention at least has the following steps: first, a cooling module is designed to use the computer software emulation system and the method of numerical value operation experiments to get the corresponding relation between the noise values and the operation parameters of the mentioned cooling module in different operation parameters; then a appropriate heat resistance range is selected from the radiant characteristics of the cooling module, and the noise value corresponding to the heat resistance is determined; finally it will identify whether the noise value range meets the permissible range or not, to decide if it is required to modify the design or to proceed with the next stage of the engineering.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

According to the noise value evaluation method of the cooling module in the present invention, especially the design of the heat emission fan used in a computer system, it aims to evaluate whether its noise value meets the permissible range at an early stage of the fan-design, then to decide whether it is required to modify the design or to proceed with the next stage of the engineering, avoiding a possible waste of manufacturing cost and a delay of the production process, like in the traditional design.

Figure 1:
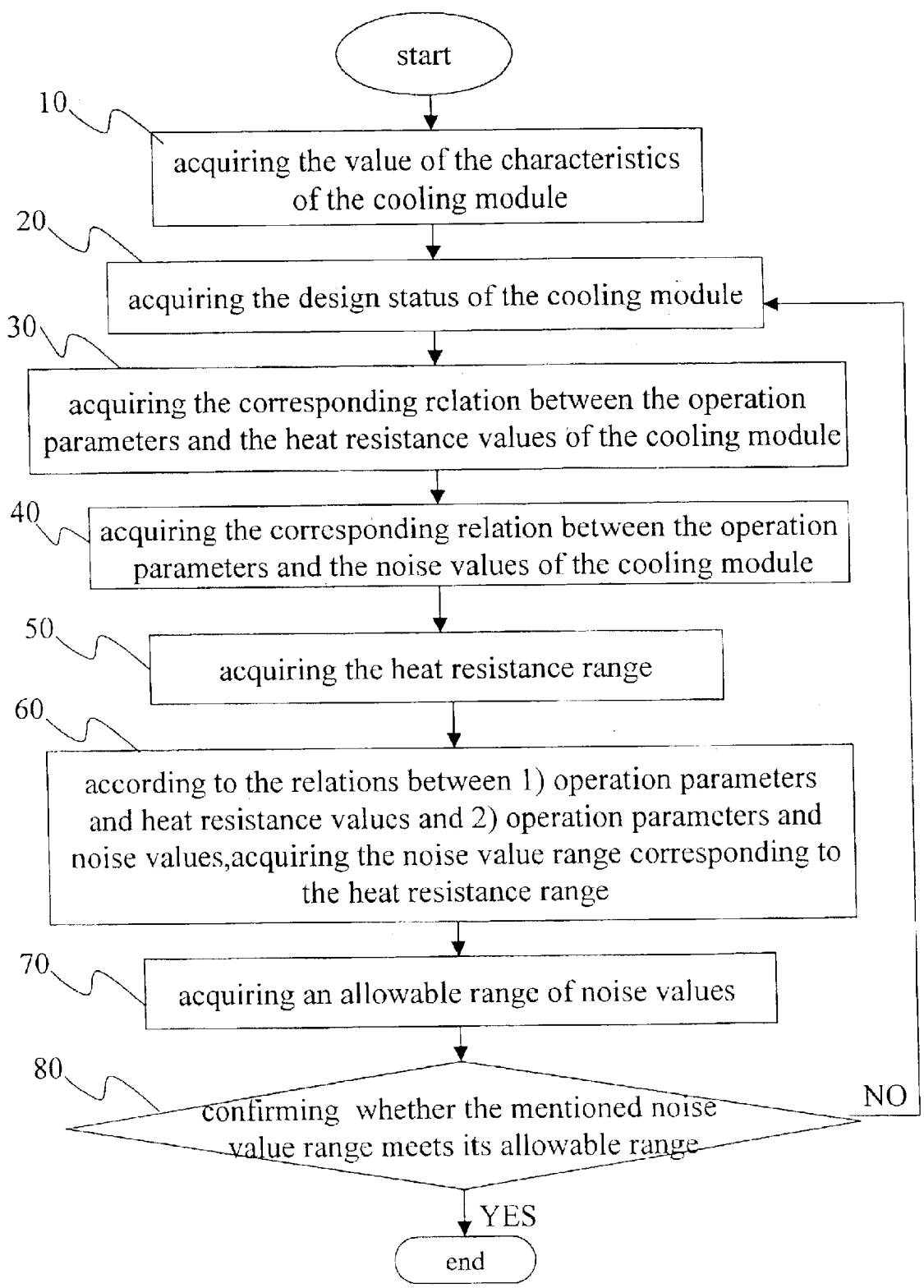
FIG. 1 is a flow chart of the first example according to the noise value evaluation method for a cooling module disclosed in the present invention.

According to the noise value evaluation method for the cooling module in the present invention, the flow chart of the first example refers to FIG. 1:

First, acquiring the value of the characteristics of the cooling module (step 10), wherein the cooling module refers to the PC or the laptop. The fan specification is set, such as the rotation speed, radiant effect, the surface area of the vane and the limit of noise value etc.

Second, acquiring the design status of the cooling module (step 20). During the design of the fan, there are many things need to be considered, like: synchronous engineering design, heat flow design, structure design, destruction analysis, vibration analysis, static force analysis, noise analysis, design optimization and mechanical allowance etc. For the fan, the key factor in design is the efficiency of heat emission, but it also needs to design the balance status of all the factors, to give attention to all parts of performance.

Third, acquiring the corresponding relation between the operation parameters and the heat resistance values of the cooling module (step 30), wherein the operation parameters refer to the rotation speed of the fan. The designed cooling module uses a computer software emulation system and a numerical value operation experiment to achieve the corresponding relation between the heat resistance values and rotation speeds in different rotation speeds of the fan.

Fourth, acquiring the corresponding relation between the operation parameters and the noise values of the cooling module (step 40), the designed cooling module uses the computer software emulation system and product specification estimations to achieve the relation between the noise values and different rotation speeds.

Finally, acquiring the heat resistance range (step 50), based on the efficiency of heat emission in the design of a cooling module, to achieve the appropriate heat resistance range. Then, according to the relations between 1) operation parameters and heat resistance values and 2) operation parameters and noise values, acquiring the noise value range corresponding to the heat resistance range (step 60). According to the relations between the heat resistance values and operation parameters and between the noise values and the operation parameters of the cooling module, it first acquires the rotation speed range corresponding to the heat resistance range, then the noise value range corresponding to the rotation speed range.

Acquiring an allowable range of noise values again (step 70), according to the customer requirements for the range of noise values produced by the fan to define the range of noise values. Finally, confirming whether the mentioned noise value range meets its allowable range (step 80), the noise value range calculated from the heat resistance value range is compared with the allowable range of noise value. The evaluation of the process of noise value of the fan will be completed when the calculated range is allowable values. If the noise value is beyond the allowable range, the cooling module must be redesigned, and it is not necessary to test noise values until the test fan is produced, therefore time and cost of the whole design of the cooling module can be saved.

Figure 2A:
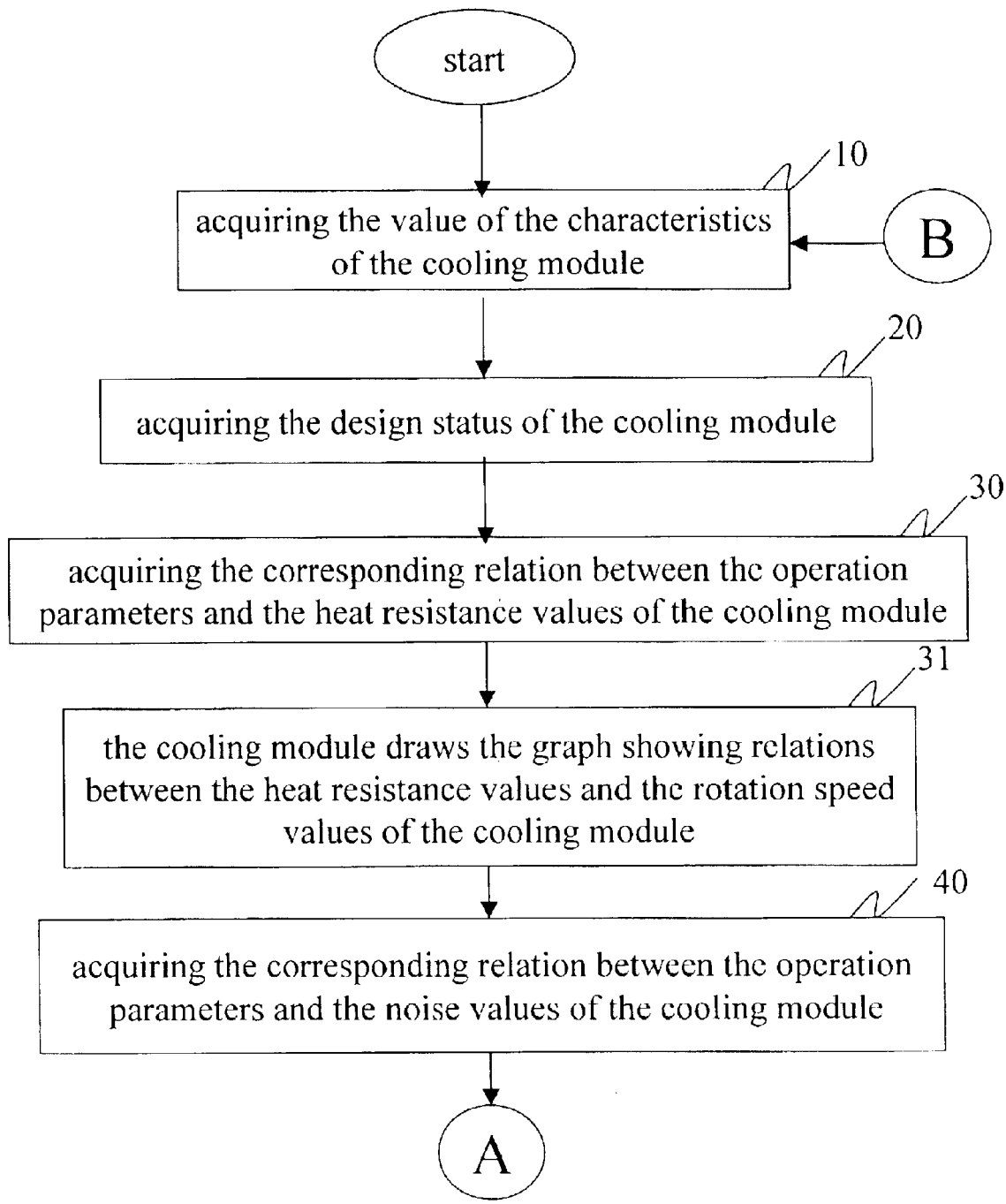
FIGS. 2A and 2B are the flow charts of the second example of the noise value evaluation method for the cooling module of the present invention.
Figure 2B:
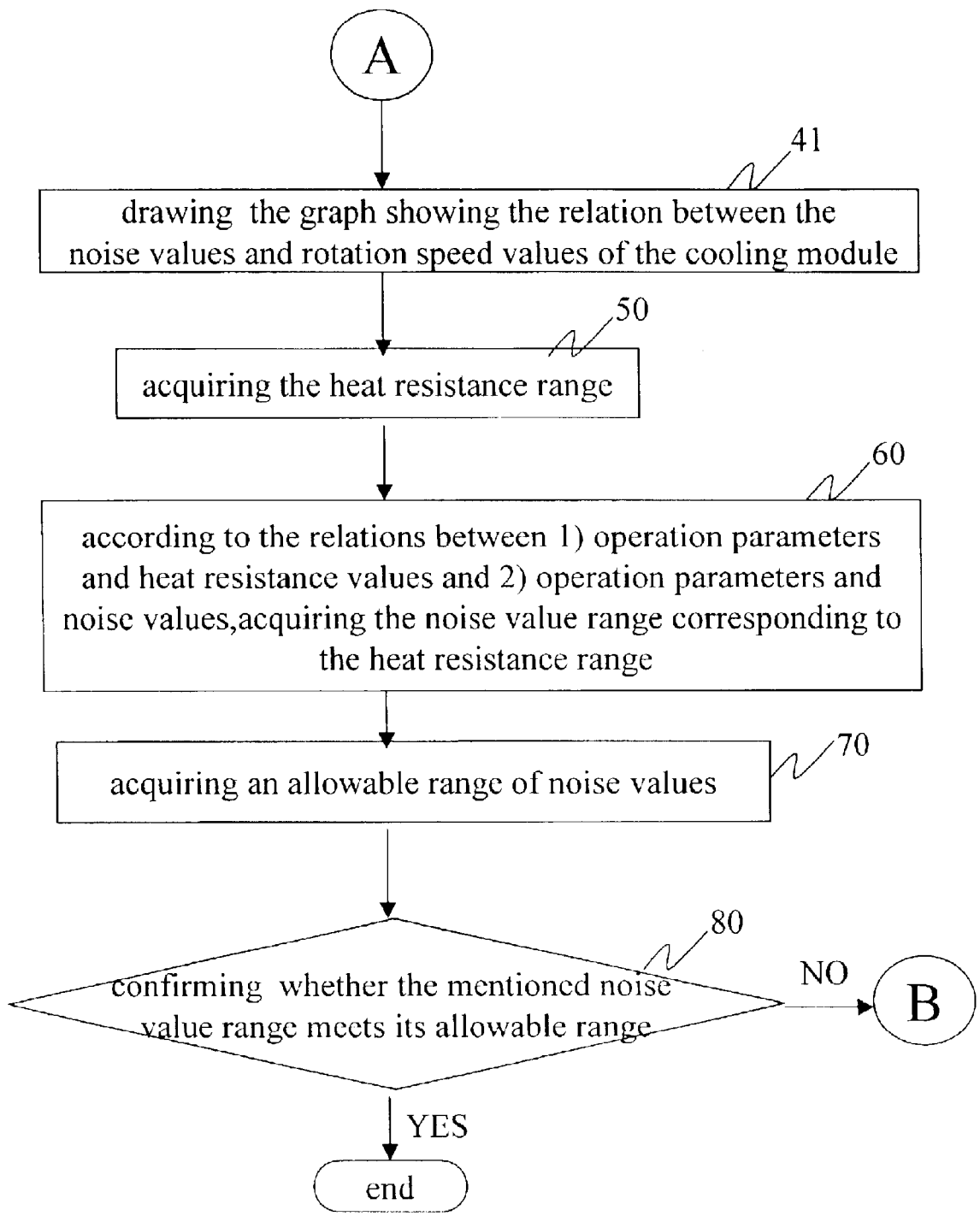

According to the noise value evaluation method for cooling modules in the present invention, the second flow chart refers to FIGS. 2A and 2B:

First, referring to FIG. 2A, acquiring the value of the characteristics of the cooling module (step 10), wherein the cooling module refers to the fans in PC or the laptop. The fan specifications, such as the rotation speed, radiant effect, surface area of the vane and the limit of noise values, are set.

Second, acquiring the design status of the cooling module (step 20), during the design of the fan, there are many things to be considered like: synchronous engineering design, heat flow design, structure design, destruction analysis, vibration analysis, static force analysis, noise analysis, design optimization and mechanical allowance etc. For the fan, the key of design is the efficiency of heat emission, but it also needs to design the balance status of all the factors, to give attention to all parts of performance.

Third, acquiring the corresponding relation between the operation parameters and the heat resistance value of the cooling module (step 30), wherein the operation parameters referring to the rotation speed of said fan. The designed cooling module uses a computer software emulation system and numerical value operation experiments to achieve the corresponding relation between the heat resistance values and rotation speeds in different rotation speeds of the fan. Further, the cooling module draws the graph showing relations between the heat resistance values and the rotation speed values of the cooling module (step 31), using computer software to draw the corresponding relation between the heat resistance values and the rotation speed values of the cooling module.

Fourth, acquiring the corresponding relation between the operation parameters and the noise values of the cooling module (step 40), the designed cooling module uses the method of a computer software emulation system and product specification estimation to achieve the corresponding relation between the noise values and different rotation speeds. Subsequently, referring to FIG. 2B drawing the graph showing the relation between the noise values and rotation speed values of the cooling module (step 41), namely using the computer to draw the corresponding relation graph between the heat resistance values and the rotation speed values of the cooling module.

Finally, acquiring the heat resistance range (step 50). Based on the efficiency of heat emission in the design of the cooling module, it acquires an appropriate heat resistance range. Then, according to the corresponding relation between operation parameters and heat resistance values as well as the corresponding relation between operation parameters and noise values, it acquires a noise value range corresponding to the heat resistance range (step 60). According to the corresponding relation between the heat resistance values and operation parameters as well the corresponding relation between the noise values and the operation parameters of the cooling module, it first acquires the rotation speed range corresponding to the heat resistance range, so the noise value range corresponding to the rotation speed range is achieved.

Acquiring an allowable range of noise values (step 70), according to the customer requirements for the range of noise values produced by the fan to define the range of noise values.

Finally, confirming whether the noise value range meets an allowable range (step 80) the noise value range calculated from heat resistance value range is compared with the allowable range of noise values, the evaluation of the process of noise values of the fan will be completed. If the calculated range is within allowable values, the next engineering phase can proceed; if the range of noise values is beyond the allowable range, the cooling module must be redesigned: it is not necessary to test noise values until the test fan is produced, therefore time and cost of the whole design of the cooling module can be saved.

The noise value evaluation method for the heat emission in the present invention, wherein analysis of the efficiencies of heat emission and noise are carried out at the early phase of cooling module design, is to confirm whether the noise values of the module are in the allowable range, and evaluating the feasibility of engineering to avoid the delay of the production process and increase of cost of manufacture, which happens if we change the design later.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A noise value evaluation method for cooling module, comprising:
   (a) acquiring a character numerical value of a cooling module;
   (b) acquiring a design status of said cooling module;
   (c) acquiring corresponding relation between an operation parameter value and a heat resistance value;
   (d) acquiring corresponding relation between said operation parameter values and a noise values;
   (e) acquiring a range of said heat resistance values;
   (f) acquiring a noise value range of said heat resistance value range on the basis of the corresponding relation between said operation parameter values and said heat resistance values, as well as said noise value;
   (g) acquiring a range of allowable noise values; and
   (h) confirming said noise value range to meet said range of allowable noise values.

2. The noise value evaluation method for cooling module as claimed in claim 1, wherein said cooling module is a fan and the operation parameter values are the rotation speeds of said fan.

3. The noise value evaluation method for cooling module as claimed in claim 1, wherein said character is selected from one of the combination of fan's rotation speed, surface area and noise values.

4. The noise value evaluation method for cooling module as claimed in claim 1, wherein said step for acquiring corresponding relation between an operation parameter value and a heat resistance values are selected from one of the combinations of a computer software emulation system and an numerical value operation experiment.

5. The noise value evaluation method for cooling module as claimed in claim 1, wherein said step for acquiring corresponding relation between an operation parameter values and a heat resistance values followed by a step of drawing the graph of relation between said operation parameter values and said heat resistance values.

6. The noise value evaluation method for cooling module as claimed in claim 1, wherein said step for acquiring corresponding relation between an operation parameter values and a heat resistance values is selected from one of the combination of the computer software emulation system and a product specifications estimation.

7. The noise value evaluation method for cooling module as claimed in claim 1, wherein said step for acquiring corresponding relation between said operation parameter values and a noise values followed by a step of drawing the graph of relation between the operation parameter values and noise values.

8. The noise value evaluation method for cooling module as claimed in claim 1, wherein said step for confirming the range of noise values meeting the range of allowable noise, when the result is no, the steps from (b) to (h) need to be performed until said rang of allowable noise meeting the allowable noise values.

* * * * *